(12) United States Patent
Miyata

(10) Patent No.: US 12,484,163 B2
(45) Date of Patent: Nov. 25, 2025

(54) ELECTRIC DEVICE

(71) Applicant: DENSO ELECTRONICS CORPORATION, Anjo (JP)

(72) Inventor: Susumu Miyata, Anjo (JP)

(73) Assignee: DENSO ELECTRONICS CORPORATION, Anjo (JP)

(*) Notice: Subject to any disclaimer, the term of this patent is extended or adjusted under 35 U.S.C. 154(b) by 302 days.

(21) Appl. No.: 18/449,535

(22) Filed: Aug. 14, 2023

(65) Prior Publication Data
US 2023/0389196 A1    Nov. 30, 2023

Related U.S. Application Data

(63) Continuation of application No. PCT/JP2022/027400, filed on Jul. 12, 2022.

(30) Foreign Application Priority Data

Jul. 20, 2021   (JP) ................. 2021-119545

(51) Int. Cl.
H05K 5/00   (2025.01)
H05K 1/18   (2006.01)
H05K 5/02   (2006.01)

(52) U.S. Cl.
CPC .......... H05K 5/0069 (2013.01); H05K 1/181 (2013.01); H05K 5/0217 (2013.01); H05K 5/0247 (2013.01)

(58) Field of Classification Search
CPC ............. H05K 1/18; H05K 1/181–187; H05K 2201/09063; H05K 2201/10083; H05K 5/00; H05K 5/0069; H05K 5/0217; H04R 1/021; H04R 1/023
USPC ................. 361/752–753, 756–759, 807–810
See application file for complete search history.

(56) References Cited

U.S. PATENT DOCUMENTS

| | | | | |
|---|---|---|---|---|
| 4,744,009 A | * | 5/1988 | Grabbe | H01L 23/4985 361/752 |
| 7,052,291 B2 | * | 5/2006 | Barina | H01R 12/7005 361/758 |
| 7,227,761 B2 | * | 6/2007 | Estes | H05K 7/142 361/810 |
| 7,593,239 B2 | * | 9/2009 | Li | H05K 7/142 361/803 |

(Continued)

FOREIGN PATENT DOCUMENTS

| | | |
|---|---|---|
| JP | 2013239881 A | 11/2013 |
| JP | 2018121249 A | 8/2018 |
| WO | WO-2016017139 A1 | 2/2016 |

*Primary Examiner* — Tuan T Dinh
(74) *Attorney, Agent, or Firm* — Harness, Dickey & Pierce, P.L.C.

(57) ABSTRACT

An electric device includes an electric board having a board hole, a housing accommodating the electric board, a shaft portion disposed in the housing and inserted into the board hole, a recessed portion disposed in the housing, and a bonding portion. The bonding portion is interposed between the shaft portion and the recessed portion and between the recessed portion and a hole peripheral portion of the electric board that forms a peripheral edge of the board hole, and bonds the shaft portion, the hole peripheral portion, and the recessed portion. The board hole has a size such that a radial gap is provided between the hole peripheral portion of the electric board and the shaft portion.

15 Claims, 13 Drawing Sheets

(56) References Cited

U.S. PATENT DOCUMENTS

| | | | |
|---|---|---|---|
| 10,888,173 B2* | 1/2021 | Shakal | F16F 15/08 |
| 2007/0180264 A1* | 8/2007 | Ni | H05K 5/0269 |
| | | | 361/752 |
| 2011/0103033 A1* | 5/2011 | Suetomi | G06F 3/03547 |
| | | | 29/592.1 |
| 2019/0313192 A1 | 10/2019 | Miyata et al. | |
| 2022/0009428 A1* | 1/2022 | Sumida | H02G 3/081 |

* cited by examiner

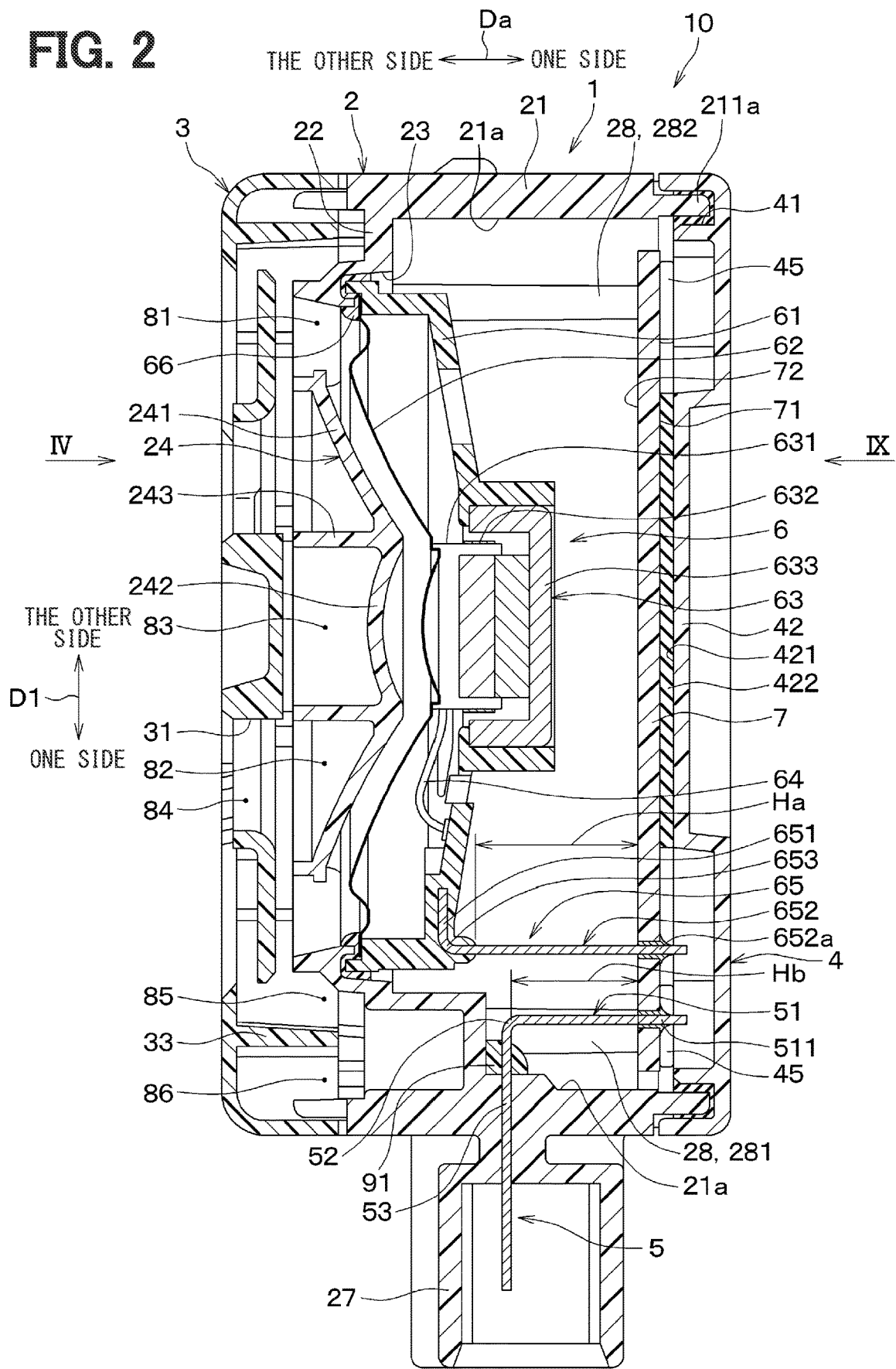

ELECTRIC DEVICE

CROSS REFERENCE TO RELATED APPLICATIONS

The present application is a continuation application of International Patent Application No. PCT/JP2022/027400 filed on Jul. 12, 2022, which designated the U.S. and claims the benefit of priority from Japanese Patent Application No. 2021-119545 filed on Jul. 20, 2021. The entire disclosures of all of the above applications are incorporated herein by reference.

TECHNICAL FIELD

The present disclosure relates to an electric device.

BACKGROUND

There has been known a vehicle sound generator used for a vehicle alarm, a vehicle approach notification device and the like. In the sound generator, sound is generated by applying a current to a voice coil and vibrating a diaphragm connected to the voice coil.

SUMMARY

The present disclosure provides an electric device including an electric board, a housing, a shaft portion, a recessed portion, and a bonding portion. The electrical board has a board hole. The housing accommodates the electric board. The shaft portion is disposed in the housing, has a tip end and a base end fixed to the housing, and is inserted into the board hole. The recessed portion is disposed in the housing, is fixed to the housing, and has a recess that is recessed so as to face the tip end of the shaft portion. The bonding portion is interposed between the recessed portion and a hole peripheral portion that forms a peripheral edge of the board hole of the electric board, and between the shaft portion and the recessed portion, is formed of an adhesive, and bonds the shaft portion, the hole peripheral portion, and the recessed portion. The board hole has a size such that a gap is provided between the hole peripheral portion and the shaft portion.

BRIEF DESCRIPTION OF DRAWINGS

Objects, features and advantages of the present disclosure will become apparent from the following detailed description made with reference to the accompanying drawings. In the drawings:

FIG. 2 is a cross-sectional view showing a cross section taken along line II-II in FIG. 1A;

DETAILED DESCRIPTION

Figure 1A:
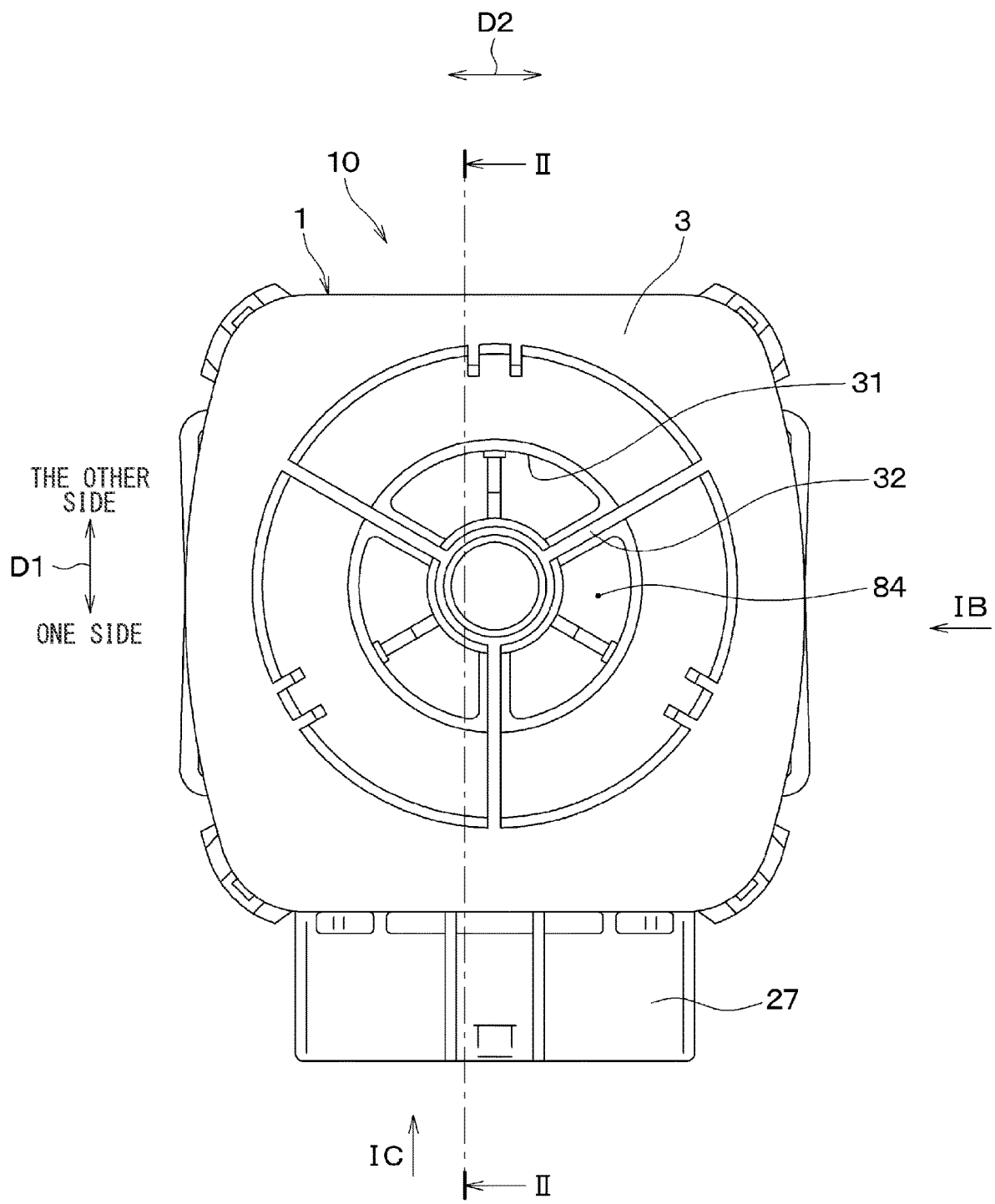
FIG. 1A is a front view of a sound generator that is an electric device according to a first embodiment.
Figure 1B:
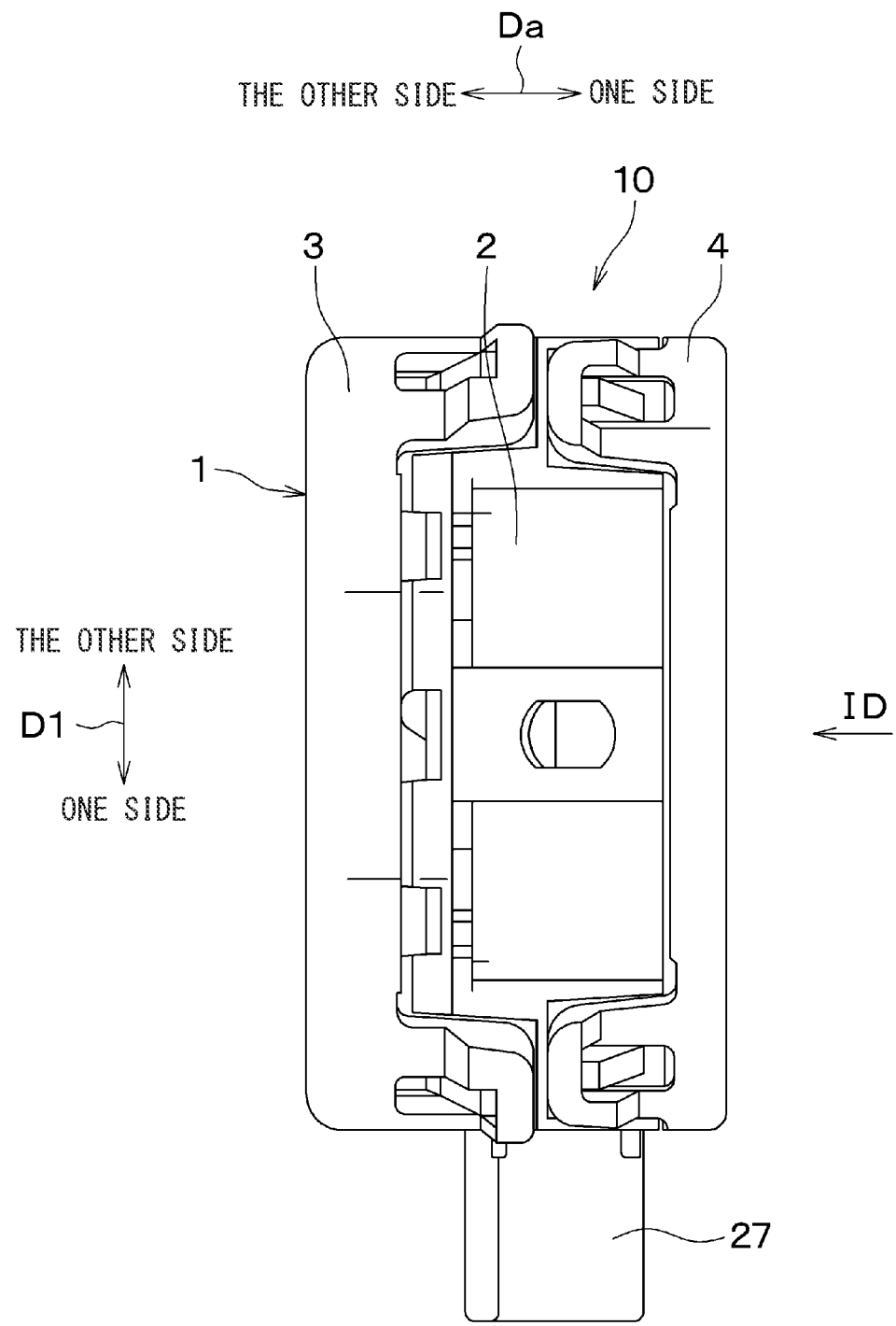
FIG. 1B is a right side view of the sound generator of the first embodiment, and is an arrow view in IB direction in FIG. 1A.

Next, a relevant technology is described only for understanding the following embodiments. In a sound generator, sound is generated by applying a current to a voice coil and vibrating a diaphragm connected to the voice coil. The voice coil is electrically connected to an external harness via a metal element of a sounding body and a terminal of a connector.

In this type of sound generator, in addition to the sounding body, an electric board formed with a circuit for driving the sounding body may also be disposed inside a housing of the sound generator. In this case, a terminal and a terminal metal element are connected via the circuit on the electric board.

As a result of detailed studies performed by the inventor, the following has been found. An electric device such as a sound generator may be mounted, for example, in an engine room of a vehicle. In this case, the electric device is exposed to a temperature environment from a low temperature to a high temperature. The electric device used in such an environment may cause a failure due to stress of expansion and contraction caused by a temperature change.

For example, it is assumed that a force deforming an electric board included in an electric device is applied to the electric board due to expansion and contraction of a plurality of components constituting the electric device due to a temperature change. When the electric board is deformed in this manner, for example, a crack may occur in a soldered portion of an electric component mounted on the electric board to cause a conduction failure.

An electric device according to an aspect of the present disclosure includes an electric board, a housing, a shaft portion, a recessed portion, and a bonding portion. The electrical board has a board hole. The housing accommodates the electric board. The shaft portion is disposed in the housing, has a tip end and a base end fixed to the housing, and is inserted into the board hole. The recessed portion is disposed in the housing, is fixed to the housing, and has a recess that is recessed so as to face the tip end of the shaft portion. The bonding portion is interposed between the recessed portion and a hole peripheral portion that forms a peripheral edge of the board hole of the electric board, and between the shaft portion and the recessed portion, is formed of an adhesive, and bonds the shaft portion, the hole peripheral portion, and the recessed portion. The board hole has a size such that a gap is provided between the hole peripheral portion and the shaft portion.

According to this configuration, the electrical board can be held by the bonding portion and the shaft portion, and a difference in expansion and contraction between the housing and the electrical board due to a temperature change can be absorbed by the gap between the hole peripheral portion and the shaft portion and the deformation of the bonding portion. Therefore, bending deformation of the electric board due to the difference in expansion and contraction between the housing and the electric board is less likely to occur, for example, as compared with a case where the shaft portion is fitted into the board hole without a gap. Therefore, it is possible to restrict the occurrence of a failure in the electric board due to a temperature change.

The following will describe embodiments of the present disclosure with reference to the accompanying drawings. In the following embodiments including other embodiments to be described later, the same or equivalent components are denoted by the same reference symbol in the drawings.

First Embodiment

A sound generator 10, which is an electric device of the present embodiment, is mounted on an automobile, and is installed, for example, on an outside of a compartment of the automobile and is used to generate an alarm sound. In the following description, the automobile may be simply referred to as a vehicle.

As shown in FIG. 1A, FIG. 1B, FIG. 1C, FIG. 1D and FIG. 2, the sound generator 10 includes a housing 1 in which a space is formed, a plurality of terminals 5, a sounding body 6, and an electric board 7. The housing 1 includes a base 2, a front cover 3, and a rear cover 4. The base 2, the front cover 3, and the rear cover 4 are all made of resin. The rear cover 4 is disposed on one side of the base 2 in a component arrangement direction Da, and the front cover 3 is disposed on the other side of the base 2 in the component arrangement direction Da. The sounding body 6 and the electric board 7 are accommodated in the housing 1. The rear cover 4 corresponds to one-side cover of the present disclosure.

As shown in FIG. 2, the base 2 includes a base cylindrical portion 21, a partition wall 22, a shielding plate 24, and a connector 27. Since the base cylindrical portion 21 is formed in a substantially rectangular cylindrical shape, the base cylindrical portion 21 has a base inner wall surface 21a that is an inner wall surface facing an inside of the base cylindrical portion 21. The base cylindrical portion 21 has an one-end side opening provided on the one side in the component arrangement direction Da and the other-end side opening provided on the other side in the component arrangement direction Da. The rear cover 4 having a plate shape and covering the one-end side opening is joined to the one-end side opening of the base cylindrical portion 21.

Figure 3:
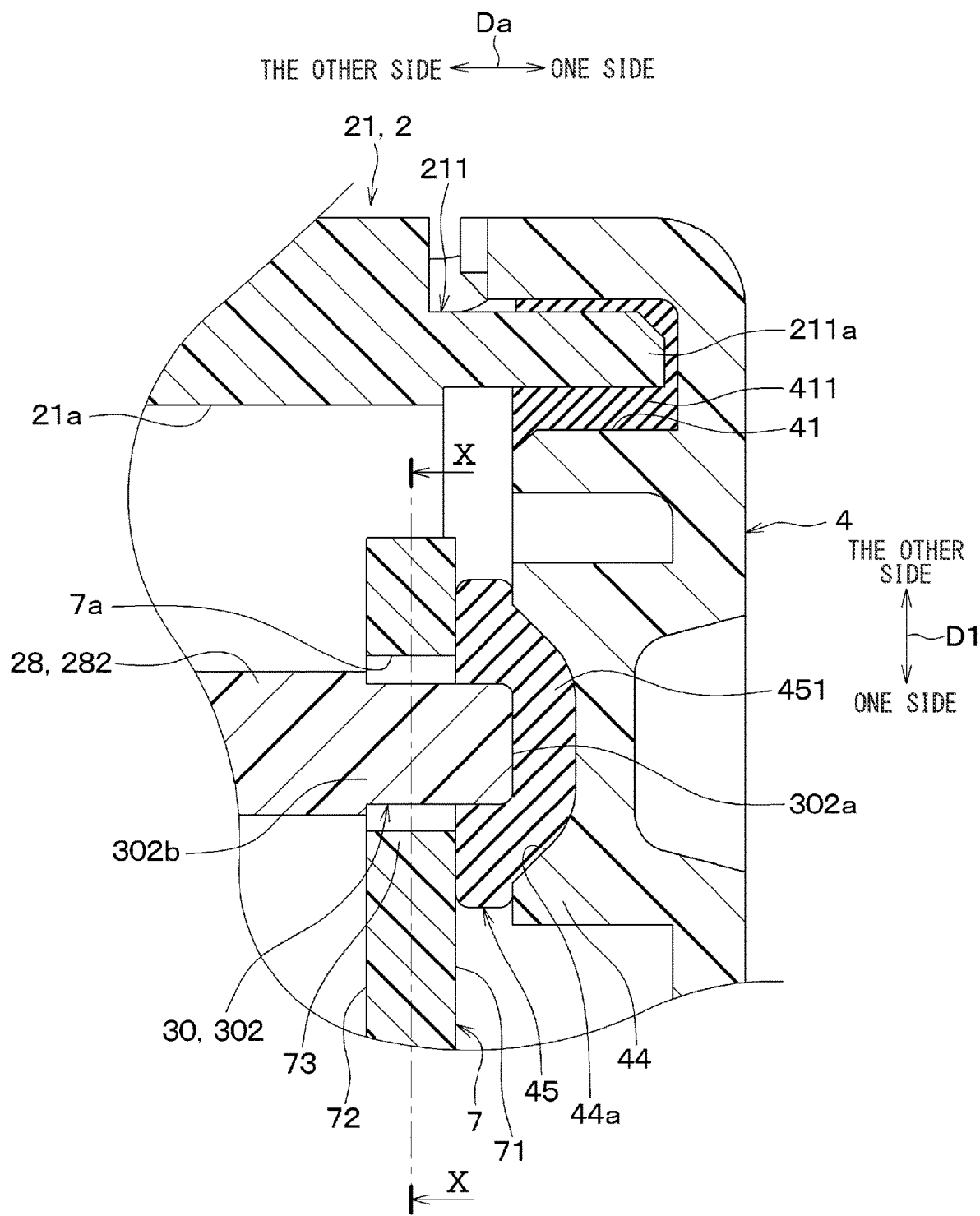
FIG. 3 is a cross-sectional view showing a cross section taken along line III-III of FIG. 1D, and is an enlarged view showing the vicinity of a second shaft portion.
Figure 4:
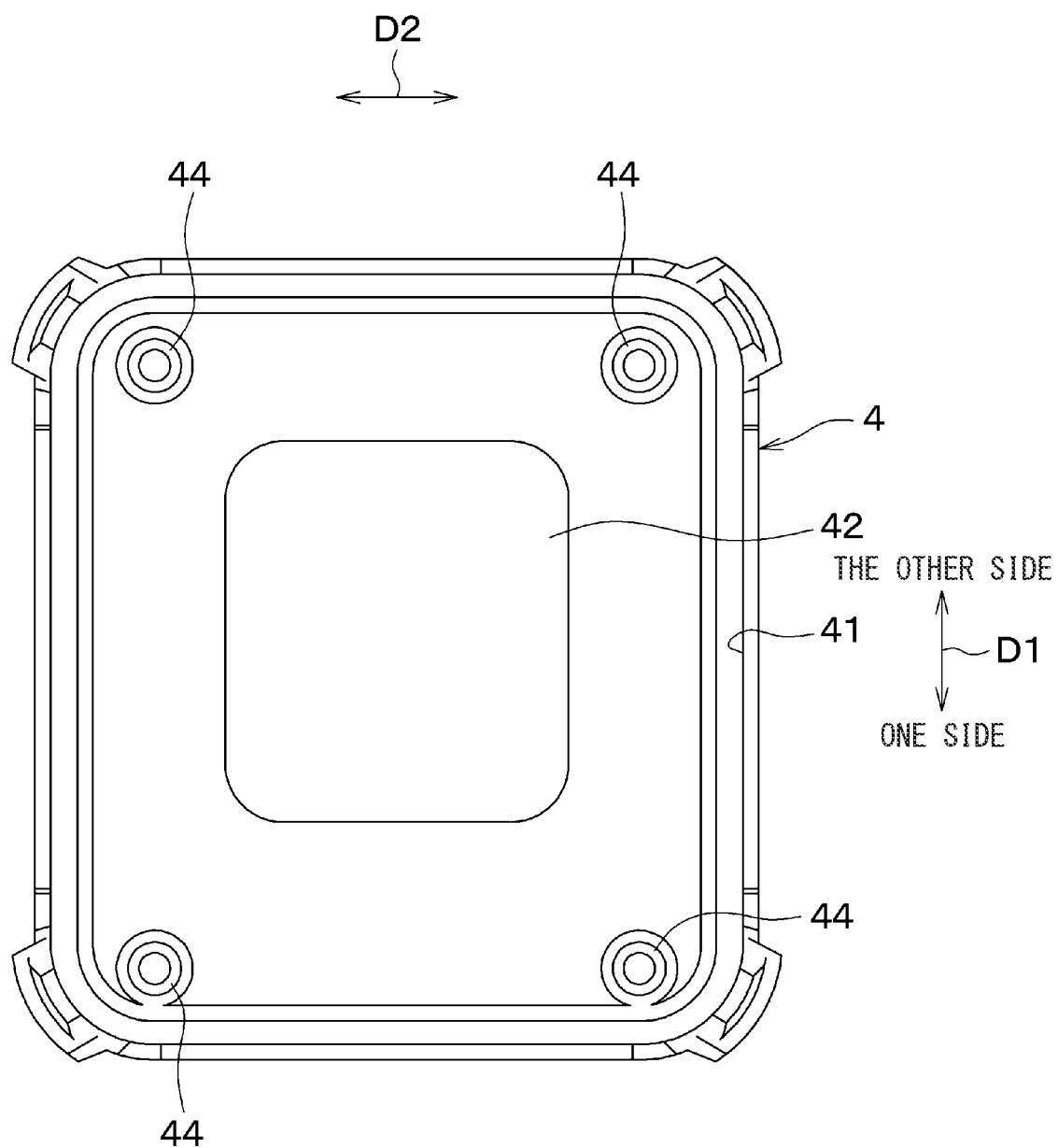
FIG. 4 is a diagram showing a single body of a rear cover included in the sound generator of the first embodiment as viewed in a direction indicated by an arrow IV in FIG. 2.
Figure 5:
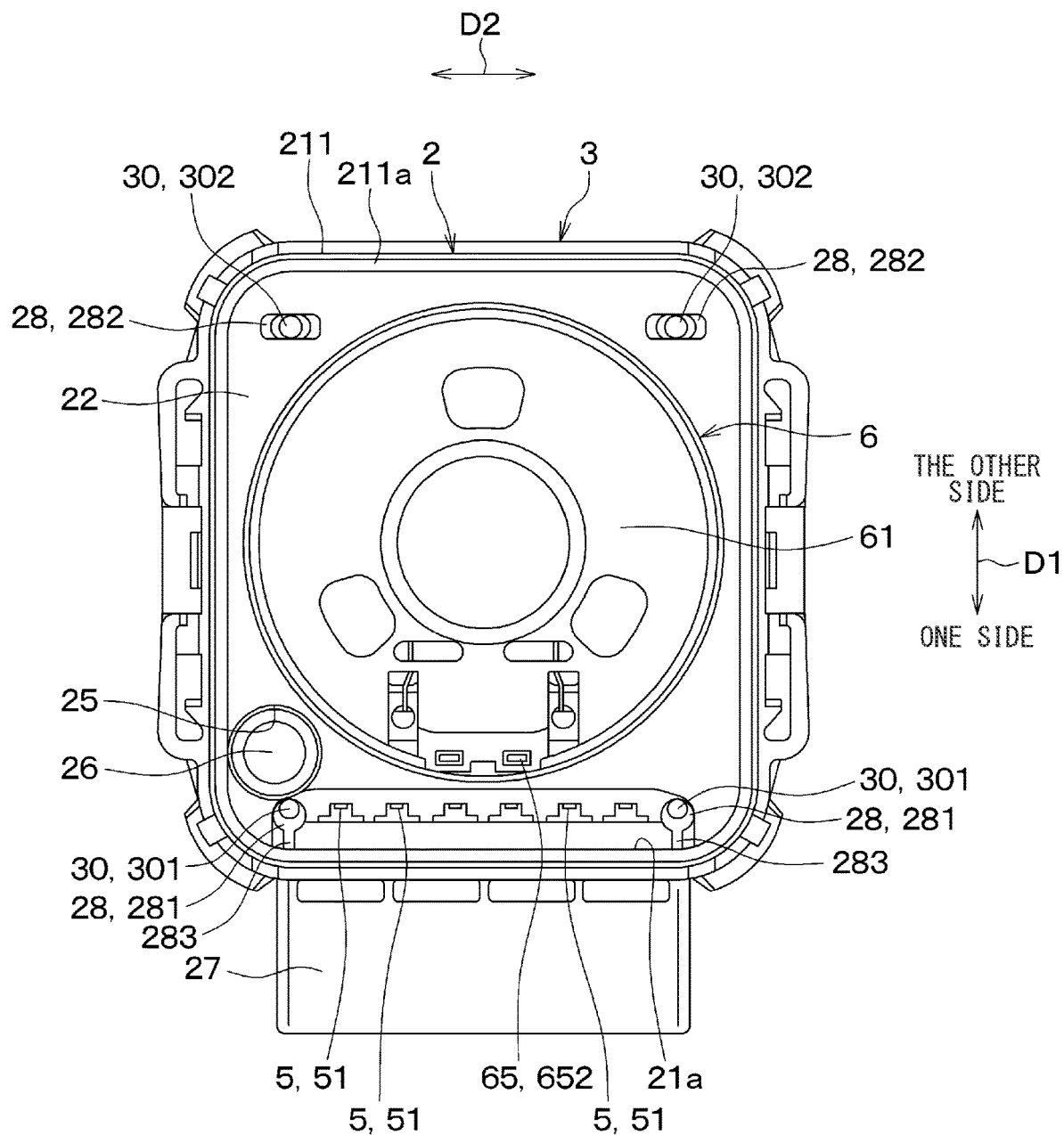
FIG. 5 is a rear view showing the sound generator of the first embodiment before an electric board and the rear cover are attached.

Specifically, as shown in FIGS. 3 to 5, the rear cover 4 has a cover peripheral edge portion 41 at a peripheral edge of the rear cover 4, and the cover peripheral edge portion 41 is provided over the entire length of the peripheral edge of the rear cover 4 and is formed in an annular shape. On the other hand, the base cylindrical portion 21 has a base peripheral edge portion 211 at an edge of the base cylindrical portion 21 on the one side in the component arrangement direction Da (that is, a peripheral edge of the one-end side opening portion). The edge of the base cylindrical portion 21 on the one side in the component arrangement direction Da is, in other words, an edge provided at the peripheral edge of the base 2 on the one side in the component arrangement direction Da. The base peripheral edge portion 211 is provided over the entire length of the edge of the base cylindrical portion 21 on the one side in the component arrangement direction Da, and is formed in an annular shape. The cover peripheral edge portion 41 and the base peripheral edge portion 211 are bonded to each other so that a boundary between the rear cover 4 and the base cylindrical portion 21 is sealed.

More specifically, the cover peripheral edge portion 41 has a groove that is recessed toward the one side in the component arrangement direction Da, and the groove extends annularly over the entire length of the peripheral edge of the rear cover 4. The base peripheral edge portion 211 has a groove insertion portion 211a inserted into the groove of the cover peripheral edge portion 41, and the groove insertion portion 211a is hermetically bonded to the cover peripheral edge portion 41 by an adhesive 411. Various types of the adhesive 411 are conceivable. For example, the adhesive 411 is a silicone-based adhesive.

As shown in FIG. 2, the front cover 3 having a plate shape and covering the other-end side opening is fitted into the other-end side opening of the base cylindrical portion 21.

The space in the housing 1 is divided into two sections, that is, a section on the one side (in other words, the rear surface side) and a section on the other side (in other words, on the front side) in the component arrangement direction Da, by the partition wall 22 provided in the base cylindrical portion 21. That is, the inside of the housing 1 is divided into a space formed by the base cylindrical portion 21, the partition wall 22, and the front cover 3, and a space formed by the base cylindrical portion 21, the partition wall 22, and the rear cover 4. As described above, the partition wall 22 is formed inside the housing 1 and partitions the space inside the housing 1 in the component arrangement direction Da.

The partition wall 22 has a through hole 23 having a circular shape. The through hole 23 is closed by the sounding body 6. Specifically, the partition wall 22 protrudes toward the front cover 3 at an opening end of the through hole 23. A tip portion of the protruding portion is folded inward, and a frame 61, which will be described later, is fitted into a recessed portion formed by folding the tip portion.

The shielding plate 24 is disposed on the other side in the component arrangement direction Da with respect to the sounding body 6. The shielding plate 24 restricts water or the like adhering to a surface of the front cover 3 from reaching the sounding body 6 and restricts damage of the sounding body 6 due to the adhesion of water or the like. The shielding plate 24 is configured to include an outer peripheral portion 241 and an inner peripheral portion 242. The outer peripheral portion 241 has a hollow circular truncated cone shape in which a diameter increases toward the other side in the component arrangement direction Da. The inner peripheral portion 242 has a dome shape protruding toward the other side in the component arrangement direction Da. The shielding plate 24 is connected to the partition wall 22 by a beam member (not shown).

A sound generated by the sounding body 6 travels to an outside of the housing 1 through a space between the protrusion of the partition wall 22 and the shielding plate 24.

A passage of sound formed by the partition wall 22 and the shielding plate 24 is referred to as a sound passage 81.

The shielding plate 24 has a configuration for amplifying a sound pressure of a sound having passed through the sound passage 81. Specifically, the shielding plate 24 has a cylindrical portion 243 protruding from the outer edge of the inner peripheral portion 242 toward the front cover 3. The outer peripheral portion 241 and the cylindrical portion 243 of the shielding plate 24 and the front cover 3 form a resonance chamber 82. The inner peripheral portion 242 and the cylindrical portion 243 of the shielding plate 24 and the front cover 3 form a resonance chamber 83.

Figure 6:
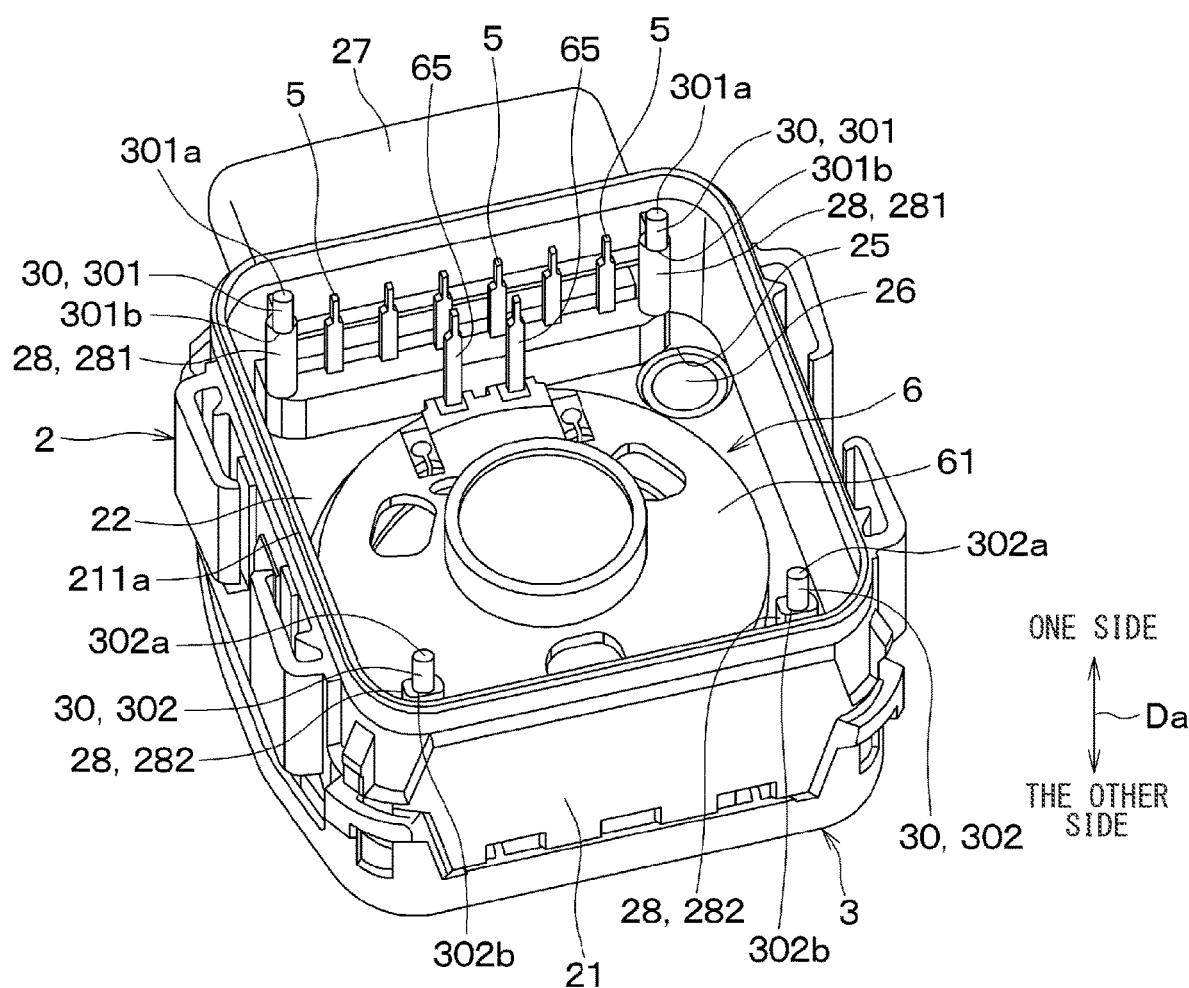
FIG. 6 is a perspective view of the sound generator of the first embodiment as viewed from one side in a component arrangement direction before the electric board and the rear cover are attached, and is a view showing the sound generator in a posture in which a connector faces upward in the drawing.
Figure 7:
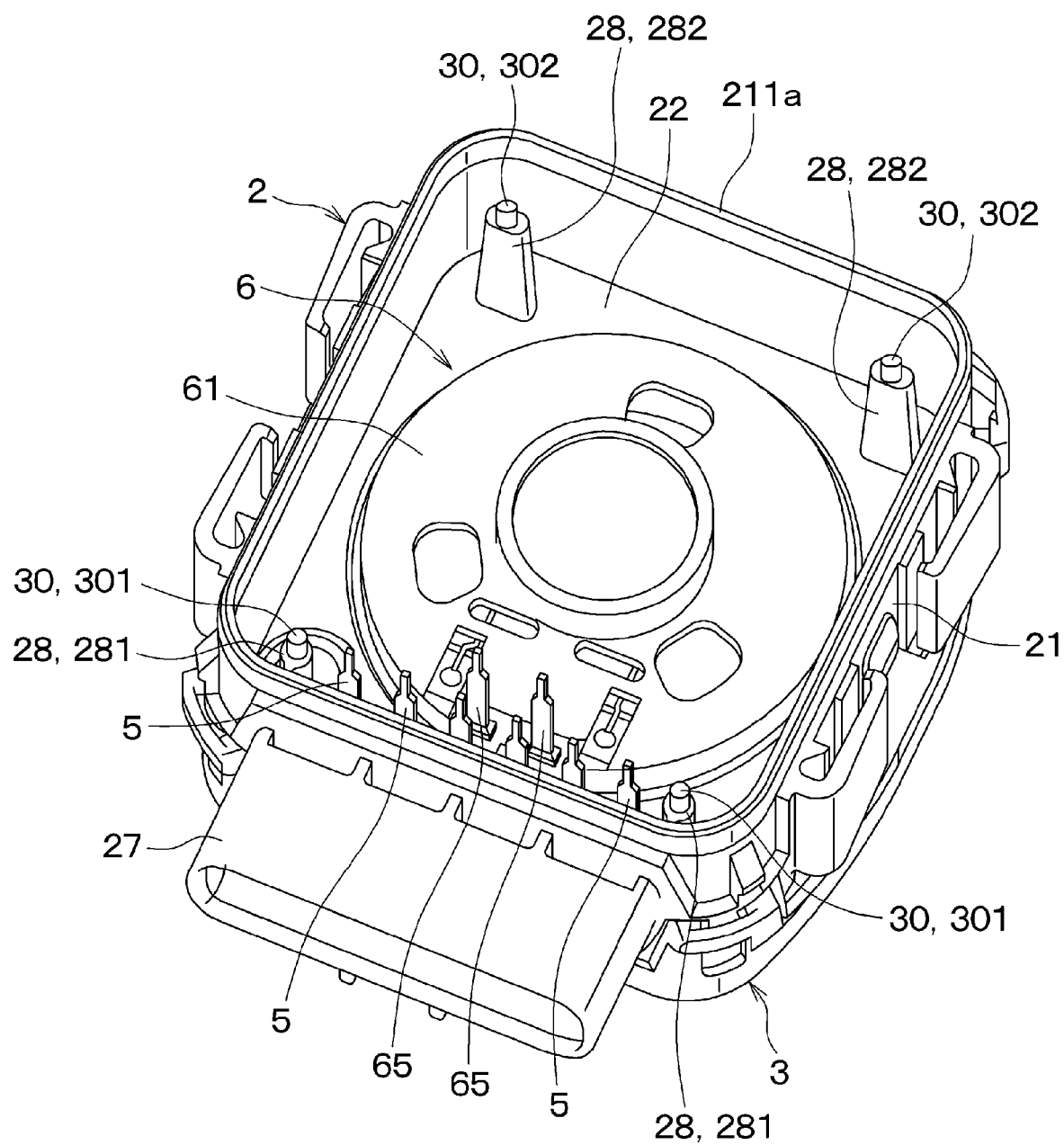
FIG. 7 is a perspective view of the sound generator of the first embodiment as viewed from the one side in the component arrangement direction before the electric board and the rear cover are attached, and is a view showing the sound generator in a posture in which the connector faces downward in the drawing.

As shown in FIG. 5 and FIG. 6, the partition wall 22 has a ventilation hole 25 formed at a position apart from the through hole 23 and the sounding body 6. The ventilation hole 25 is provided to restrict the occurrence of a pressure difference due to a temperature change between the space formed by the base cylindrical portion 21, the partition wall 22, and the front cover 3 and the space formed by the base cylindrical portion 21, the partition wall 22, and the rear cover 4. The ventilation hole 25 is attached with a ventilation film 26. The ventilation film 26 is configured to allow air to pass therethrough and block water.

As shown in FIG. 1A and FIG. 2, the front cover 3 has a substantially rectangular shape corresponding to the base cylindrical portion 21. In an inner peripheral portion of the front cover 3, a through hole 31 having a circumferential shape is formed at a position corresponding to the outer peripheral portion 241 of the shielding plate 24. The through hole 31 is for discharging a sound whose sound pressure is amplified by the resonance chambers 82 and 83 to the outside of the housing 1 through the sound passage 81.

The front cover 3 includes connecting portions 32 each having a beam shape and a cylindrical portion 33. The inside and the outside of the through hole 31 of the front cover 3 are connected by the connecting portions 32. The connecting portions 32 divide the through hole 31 into a plurality of portions. The through hole 31 divided into the plurality of portions form sound emission holes 84 through which the space inside the housing 1 is opened to the outside of the housing 1 and the sound generated by the sounding body 6 is emitted to the outside.

As shown in FIG. 2, the cylindrical portion 33 of the front cover 3 is provided in the outer peripheral portion of the front cover 3, and is formed in a cylindrical shape protruding toward the one side in the component arrangement direction Da toward the inside of the housing 1. The cylindrical portion 33 is disposed so as to protrude into a space surrounded by the base cylindrical portion 21, the partition wall 22, and a side wall of the cover 3. In the space surrounded by the base cylindrical portion 21, the partition wall 22, and the side wall of the front cover 3, a portion inside the cylindrical portion 33 is defined as a resonance chamber 85, and a portion outside the cylindrical portion 33 is defined as a resonance chamber 86.

The sound generated by the sounding body 6 passes through the sound passage 81, the sound pressure is amplified by the resonance chambers 82, 83, 85, and 86, and is emitted to the outside of the housing 1 through the sound emission holes 84.

As shown in FIG. 1A, FIG. 1B, FIG. 1C, FIG. 1D, FIG. 2 and FIG. 7, the connector 27 of the base 2 is provided outside the base cylindrical portion 21, and is formed in a substantially rectangular cylindrical shape protruding from the base cylindrical portion 21 in a direction perpendicular to the component arrangement direction Da. The connector 27 is disposed on a lower surface of the base cylindrical portion 21 and opens in a downward direction of the housing 1.

Figure 1C:
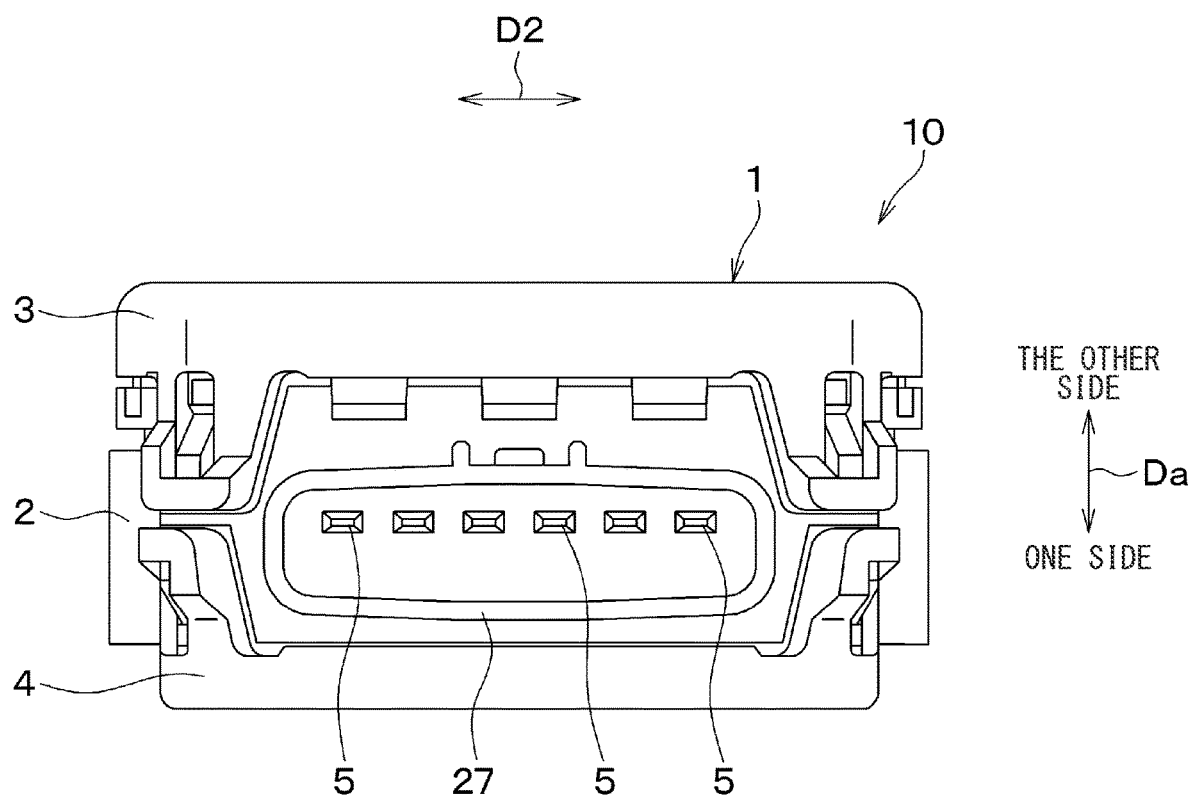
FIG. 1C is a bottom view of the sound generator of the first embodiment, and is an arrow view in IC direction in FIG. 1A.
Figure 1D:
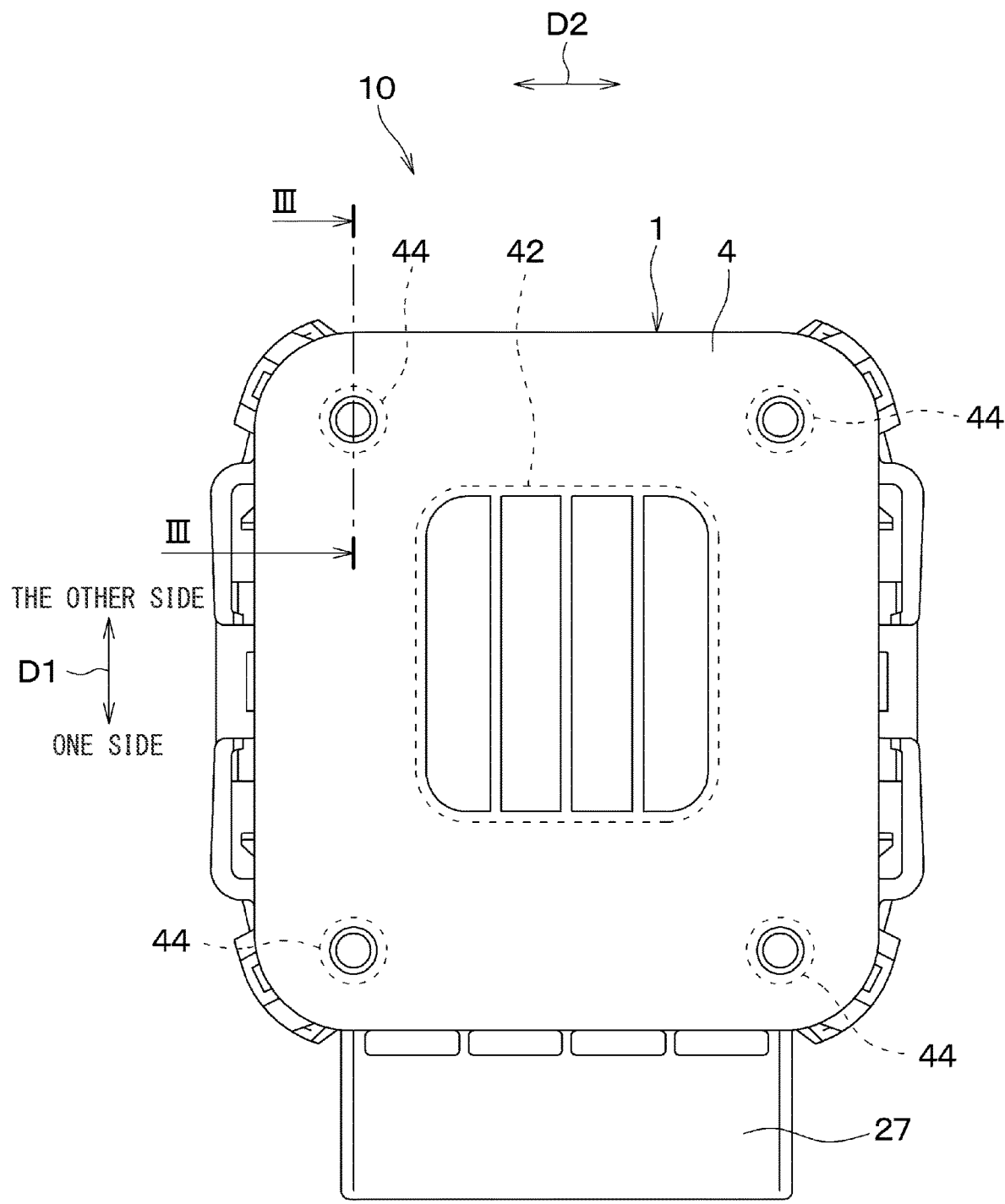
FIG. 1D is a rear view of the sound generator of the first embodiment, and is an arrow view in ID direction in FIG. 1B.

As shown in FIG. 1C and FIG. 2, the terminals 5 are arranged inside the connector 27. The terminals 5 electrically connect the electric board 7 to the outside of the housing 1. In other words, the terminals 5 connect the electric board 7 and the outside of the housing 1 so as to establish electric continuity.

Since the terminals 5 penetrate the side wall of the base cylindrical portion 21, portions of the terminals 5 are exposed into the housing 1 from the base inner wall surface 21a that is the inner wall surface of the housing 1. Bases of the portions of the terminals 5 exposed from the base inner wall surface 21a into the housing 1 are covered with an adhesive 91 and fixed to the base cylindrical portion 21.

In the terminals 5, portions exposed from the base inner wall surface 21a and the adhesive 91 to the inside of the housing 1 (that is, in-housing exposed portions) include terminal protruding portions 51 and terminal bent portions 52. The terminal protruding portions 51 form tip ends of the in-housing exposed portions of the terminals 5, and protrude toward the electric board 7. For example, the terminal protruding portions 51 protrude toward the one side in the component arrangement direction Da with the other side in the component arrangement direction Da as base side. That is, the terminal protruding portions 51 protrude toward the rear cover 4.

The electric board 7 is disposed at a position closer to the rear cover 4 than the bases of the terminal protruding portions 51 in the component arrangement direction Da in the space formed by the base cylindrical portion 21, the partition wall 22, and the rear cover 4. The terminals 5 are connected to the electric board 7 by soldering at tip ends 511 of the terminal protruding portions 51.

The terminal bent portions 52 of the terminals 5 are provided between the terminal protruding portions 51 and penetrating portions 53 of the terminals 5 penetrating the base cylindrical portion 21, and have bent shapes. That is, the terminals 5 are bent at the terminal bent portions 52.

As described above, the penetrating portions 53 and the terminal protruding portions 51 of the terminals 5 extend linearly, and the terminals 5 are bent vertically or substantially vertically at the terminal bent portions 52. In short, the terminals 5 are formed in L-shapes. As shown in FIG. 1C, FIG. 2, and FIG. 6, six terminals 5 are arranged in the connector 27 of the present embodiment, and each of the six terminals 5 has the terminal protruding portion 51, the terminal bent portion 52, and the penetrating portion 53, and has the L-shape.

As shown in FIG. 2 and FIGS. 6 to 8, the sounding body 6 includes the frame 61, a diaphragm 62, a driving unit 63, a plurality of lead wires 64, and a plurality of terminal metal elements 65.

The frame 61 supports the diaphragm 62 and the driving unit 63. The frame 61 has a substantially stepped cylindrical shape, and has a larger opening on the other side in the component arrangement direction Da than on the one side. The opening of the frame 61 on the other side in the component arrangement direction Da is closed by the diaphragm 62. The sounding body 6 is fitted into a recessed portion of the partition wall 22 at an edge of the opening portion of the frame 61 on the other side in the component arrangement direction Da, and is hermetically joined by adhesion with an adhesive 66. The frame 61 is made of resin.

The diaphragm 62 is configured to include an outer peripheral portion and an inner peripheral portion. The outer peripheral portion has a hollow circular truncated cone shape in which a diameter increases toward the other side in the component arrangement direction Da. The inner peripheral portion has a dome shape protruding toward the other side in the component arrangement direction Da. As described above, the shielding plate 24 has a similar shape. The inner peripheral portion 242 of the shielding plate 24 faces the inner peripheral portion of the diaphragm 62, and the outer peripheral portion 241 of the shielding plate 24 faces the outer peripheral portion of the diaphragm 62. The driving unit 63 is connected to a rear surface of the diaphragm 62.

As shown in FIG. 2, the driving unit 63 vibrates the diaphragm 62 to generate sound. The driving unit 63 includes a bobbin 631, a voice coil 632, and a magnetic circuit unit 633.

The bobbin 631 has a cylindrical shape and is joined to an outer edge of the inner peripheral portion of the diaphragm 62. The voice coil 632 is wound around the bobbin 631.

The magnetic circuit unit 633 applies a magnetic field to the voice coil 632. The magnetic circuit unit 633 includes a yoke having a bottomed cylindrical shape, a magnet having a disk shape and disposed on an inner bottom surface of the yoke, and a top plate having a disk shape and stacked on the magnet. The yoke and the top plate are made of a magnetic material. The yoke opens toward the diaphragm 62 and is disposed so as to close an opening of the frame 61 on the one side in the component arrangement direction Da.

A gap is formed between each of the magnet and the top plate and a side wall of the yoke. The voice coil 632 is arranged in the gap. Thus, a magnetic field generated between the top plate and the side wall of the yoke is applied to the voice coil 632. By applying an electric current to the voice coil 632 in this state, the bobbin 631 moves in an axial direction, the diaphragm 62 vibrates, and a sound is generated.

Figure 8:
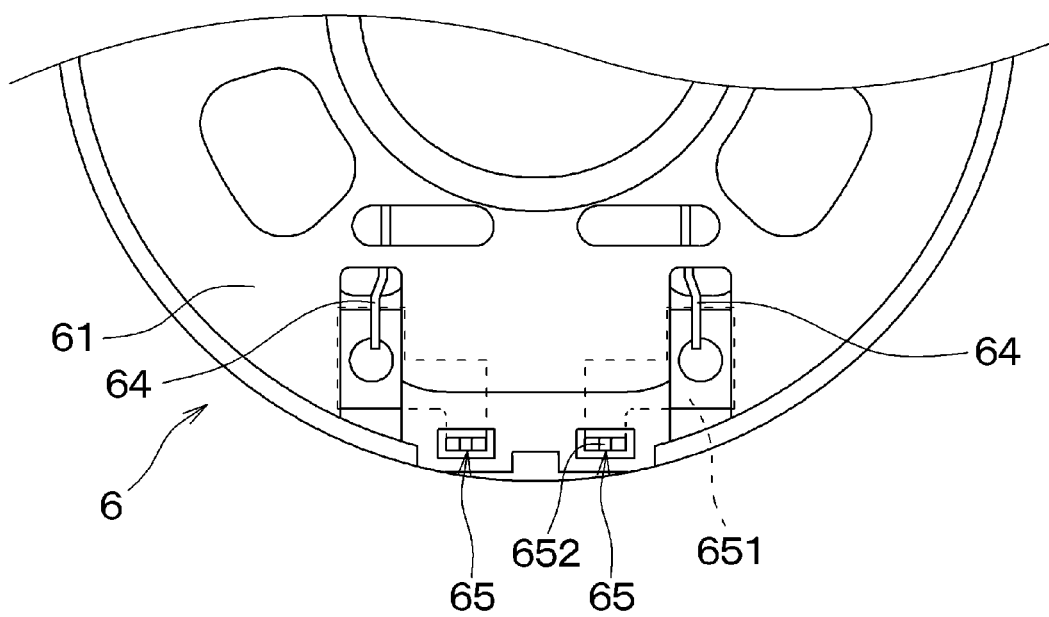
FIG. 8 is an enlarged view showing the vicinity of terminal metal elements in FIG. 5.

As shown in FIG. 2 and FIG. 8, the voice coil 632 is electrically connected to the electric board 7 by the lead wires 64 and the terminal metal elements 65. That is, one end of each of the lead wires 64 is connected to the voice coil 632, and the other end of each of the lead wires 64 is connected to one of the terminal metal elements 65.

The terminal metal elements 65 are metal components that electrically connect the driving unit 63 and the electric board 7. The terminal metal elements 65 are integrally formed with the frame 61 by insert molding, and both end portions of each of the terminal metal elements 65 are respectively exposed from the frame 61 to the one side in the component arrangement direction Da. As shown in FIG. 2, FIG. 6, and FIG. 8, one end portion of each of the terminal metal elements 65 is soldered to one of the lead wires 64, and the other end portion of each of the terminal metal elements 65 protrudes toward the electric board 7.

Each of the terminal metal elements 65 has one end portion soldered to one of the lead wire 64 as a driving unit side end portions 651 electrically connected to the driving unit 63. Each of the terminal metal element 65 has a portion protruding toward the electric board 7 and including the other end portion as a terminal metal element protruding portion 652.

The terminal metal element protruding portions 652 are exposed from the frame 61 to the one side in the component arrangement direction Da, protrude from the frame 61 toward the electric board 7, and extend linearly along the component arrangement direction Da. Each of the terminal metal elements 65 is connected to the electric board 7 by soldering at a tip end 652a of the terminal metal element protruding portion 652.

The terminal metal element protruding portions 652 are longer than the terminal protruding portions 51. Specifically, a length Ha from bases of the terminal metal element protruding portions 652 to connection portions with the electric board 7 is longer than a length Hb from the bases of the terminal protruding portions 51 to connection portions with the electric board 7.

As shown in FIG. 8, each of the driving unit side end portions 651 has a crank shape when viewed from the one side in the component arrangement direction Da. A part of each of the driving unit side end portions 651 is exposed from the frame 61, and each of the driving unit side end portion 651 is soldered to one of the lead wires 64 at the exposed portion.

As shown in FIG. 2 and FIG. 8, each of the terminal metal elements 65 includes a terminal metal element bent portion 653 having a bent shape between the driving unit side end portion 651 and the terminal metal element protruding portion 652. That is, each of the terminal metal elements 65 is bent at the terminal metal element bent portion 653. The terminal metal element bent portions 653 are covered with the frame 61.

The bent shapes of the terminal metal element bent portions 653 are determined so that protruding directions of the terminal metal element protruding portions 652 are directed to the electric board 7. In other words, the terminal metal element protruding portions 652 protrude toward the electric board 7 by the terminal metal element bent portions 653. Specifically, the terminal metal elements 65 are formed in L shapes by being bent at the terminal metal element bent portions 653, and thus the terminal metal element protruding portions 652 of the terminal metal elements 65 are in a posture of protruding toward the electric board 7.

As shown in FIG. 2, FIG. 5 and FIG. 6, the sounding body 6 of the present embodiment includes the two terminal metal elements 65. Each of the two terminal metal elements 65 includes the driving unit side end portion 651, the terminal metal element protruding portion 652, and the terminal metal element bent portion 653.

As described above, the electric board 7 is disposed in the space formed by the base cylindrical portion 21, the partition wall 22, and the rear cover 4 in the space in the housing 1. That is, the electric board 7 is disposed on the one side in the component arrangement direction Da with respect to the sounding body 6 in the space inside the housing 1. On the electric board 7, a circuit for driving the driving unit 63 by causing a current to flow through the voice coil 632 is formed by a resistor, a capacitor, and the like (not shown). Circuit components such as the resistor and the capacitor are disposed between the electric board 7 and the partition wall 22 or between the electric board 7 and the frame 61.

The driving circuit on the electric board 7 is connected to the voice coil 632 by the lead wires 64 and terminal metal elements 65. The driving circuit is connected to an ECU or the like of the vehicle by the terminals 5. When a signal is transmitted from the ECU or the like to the driving circuit via the terminals 5, a current flows through the voice coil 632 in response to the signal.

The electric board 7 is formed with through holes through which the tip ends 511 of the terminal protruding portions 51 of the terminals 5 pass. The terminals 5 are connected to the driving circuit on the electric board 7 by solder in the through holes. The electric board 7 is also formed with through holes through which the tip ends 652a of the terminal metal element protruding portions 652 of the terminal metal elements 65 pass. The terminal metal elements 65 are connected to the driving circuit on the electric board 7 by solder in the through holes.

As shown in FIG. 2 and FIG. 3, the electric board 7 is accommodated in the housing 1 in a posture in which the component arrangement direction Da corresponds to a thickness direction of the electric board 7. That is, the electric board 7 has a flat plate shape extending in a direction perpendicular to the component arrangement direction Da. The electric board 7 has one surface 71 provided on the one side in the component arrangement direction Da and the other surface 72 provided on the other side in the component arrangement direction Da.

Figure 9:
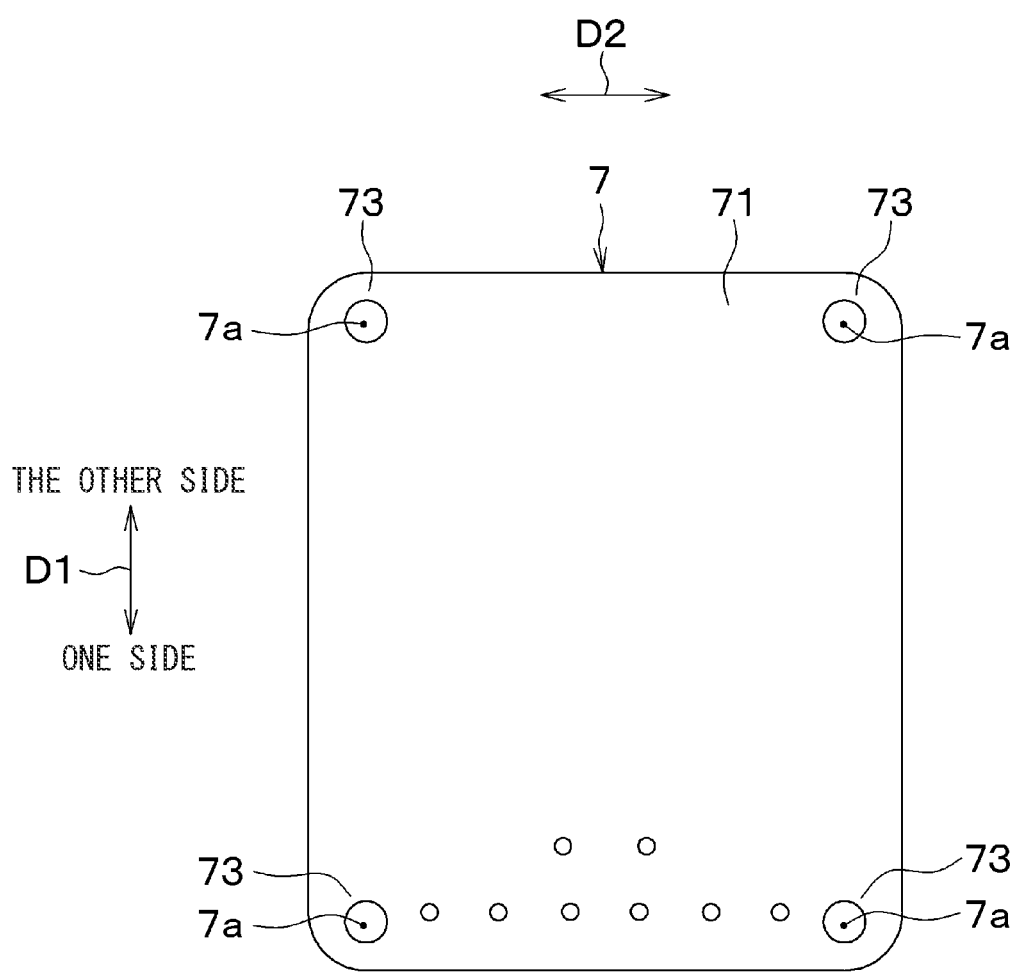
FIG. 9 is a diagram showing a single body of an electric board included in the sound generator of the first embodiment viewed in a direction of an arrow IX in FIG. 2.
Figure 10:
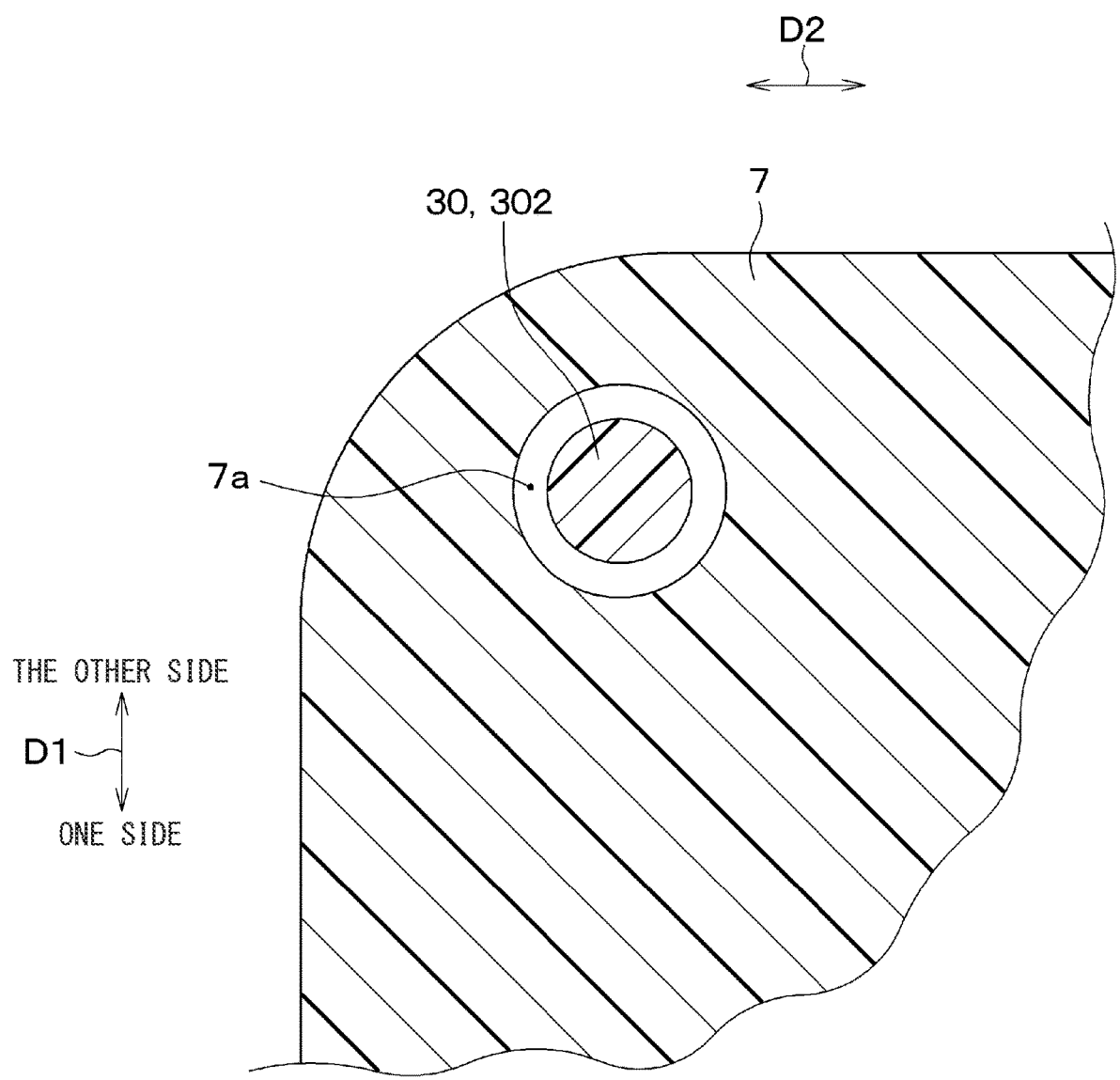
FIG. 10 is a cross-sectional view showing a cross section taken along line X-X in FIG. 3, and is an enlarged view showing the second shaft portion inserted into a board hole and the vicinity thereof.

As shown in FIG. 3, FIG. 9 and FIG. 10, the electric board 7 has a plurality of board holes 7a for connecting the electric board 7 to the base 2. The board holes 7a are through holes having circular cross sections and penetrating the electric board 7 in the component arrangement direction Da. In the present embodiment, four board holes 7a are provided and arranged at four corners of the electric board 7.

As shown in FIG. 2, FIG. 3, and FIGS. 5 to 7, the sound generator 10 includes a plurality of board attachment portions 28, a plurality of shaft portions 30, a plurality of recessed portions 44, and a plurality of bonding portions 45 disposed in the housing 1 in order to support the electric board 7 in the housing 1 using the board holes 7a. Each of the shaft portions 30 has a cylindrical shape having an axis in the component arrangement direction Da. The shat portions 30 are fixed to the board attachment portions 28, respectively. Since one board attachment portion 28, one shaft portion 30, one recessed portion 44, and one bonding portion 45 are provided for each of the board holes 7a, in the present embodiment, four board attachment portions 28, four shaft portions 30, four recessed portions 44, and four bonding portions 45 are provided.

Since the board holes 7a are arranged at the four corners of the electric board 7 as described above, the four board attachment portions 28 are respectively arranged at the four corners of the space inside the base cylindrical portion 21. For example, the board attachment portions 28 and the shaft portions 30 are integrally molded with the base 2, and the board attachment portions 28, the shaft portions 30, and the base 2 constitute a single resin component.

In the present embodiment, two of the four board attachment portions 28 closer to the terminals 5 are referred to as first board attachment portions 281, and two of the board attachment portions farther from the terminals 5 than the two first board attachment portions 281 are referred to as second board attachment portions 282. Among the four shaft portions 30, two shaft portions fixed to the first board attachment portion 281 are referred to as first shaft portions 301, and two shaft portions fixed to the second board attachment portion 282 are referred to as second shaft portions 302. However, when it is not necessary to distinguish between the first board attachment portions 281 and the second board attachment portions 282, they may be collectively and simply referred to as the board attachment portions 28. Similarly, when it is not necessary to distinguish between the first shaft portions 301 and the second shaft portions 302, they may be collectively and simply referred to as the shaft portions 30.

The first board attachment portions 281 and the second board attachment portions 282 protrude from the partition wall 22 of the base 2 toward the rear cover 4 and extend in the component arrangement direction Da. The first board attachment portions 281 are provided between the partition wall 22 and the first shaft portions 301, and the first shaft portions 301 are fixed to the partition wall 22 of the housing 1. Similarly, the second board attachment portions 282 are provided between the partition wall 22 and the second shaft portions 302, and the second shaft portions 302 are fixed to the partition wall 22 of the housing 1.

As shown in FIG. 2 and FIG. 5, the two first board attachment portions 281 are provided on one side in a first board surface direction D1 with respect to the two second board attachment portions 282. The two first board attachment portions 281 are arranged in a second board surface direction D2, and the two second board attachment portions 282 are also arranged in the second board surface direction D2. The first board surface direction D1 and the second board surface direction D2 are directions along the electric board 7 having flat plate shape, and the first board surface direction D1, the second board surface direction D2, and the component arrangement direction Da are directions intersecting each other, strictly speaking, directions perpendicular to each other. For example, the one side in the first board surface direction D1 is a lower side of the vehicle on which the sound generator 10 is mounted.

The terminal protruding portions 51 are arranged along a side wall provided on one side of the base cylindrical portion 21 in the first board surface direction D1 between the two first board attachment portions 281. Therefore, the second board attachment portions 282 are disposed at positions farther from the connection portions between the terminals 5 and the electric board 7 than the first board attachment portions 281. The connection portions between the terminals 5 and the electric board 7 are, specifically, portions where the terminal protruding portions 51 and the electric board 7 are joined by soldering.

The two terminal metal element protruding portions 652 are disposed at positions biased to the one side in the first board surface direction D1 in the housing 1, and are arranged along the arrangement of the six terminal protruding portions 51.

The second board attachment portions 282 have higher flexibility than the first board attachment portions 281. Specifically, as shown in FIG. 5, the first board attachment portions 281 are connected to the base inner wall surface 21a by connection portions 283 having plate shapes and protruding from side surfaces of the first board attachment portions 281. The first board attachment portions 281, the connection portions 283, and the base cylindrical portion 21 are integrally formed. On the other hand, since the second board attachment portions 282 protrude from the partition wall 22 in a state of being separated from the base inner wall surface 21a, the second board attachment portions 282 are more easily deformed than the first board attachment portions 281. The side surface of the first board attachment portions 281 are, in other words, outer peripheral surfaces of the first board attachment portions 281 extending in the component arrangement direction Da.

As shown in FIG. 3, FIG. 5, FIG. 6, and FIG. 10, each of the first shaft portions 301 and the second shaft portions 302 has a cylindrical shape with the component arrangement direction Da as an axial direction. That is, the axial directions of the first shaft portions 301 and the axial directions of the second shaft portions 302 are the same as the component arrangement direction Da.

The first shaft portions 301 and the second shaft portions 302 respectively have tip ends 301a and 302a provided on the one side in the component arrangement direction Da and base ends 301b and 302b provided on the other side in the component arrangement direction Da. FIG. 3 and FIG. 10 show a state in which the electric board 7 is supported by the second shaft portion 302 and the rear cover 4, but a state in which the electric board 7 is supported by the first shaft portion 301 and the rear cover 4 is similar to the state shown in FIG. 3 and FIG. 10.

The first shaft portions 301 and the second shaft portions 302 are respectively inserted into the board holes 7*a*. The first shaft portions 301 and the second shaft portions 302 protrude to the one side in the component arrangement direction Da with respect to the one surface 71 of the electric board 7. That is, the tip ends 301*a* of the first shaft portions 301 and the tip ends 302*a* of the second shaft portions 302 are located on the one side in the component arrangement direction Da with respect to the one surface 71 of the electric board 7.

The base ends 301*b* of the first shaft portions 301 are fixed to ends of the first board attachment portions 281 on the one side in the component arrangement direction Da. That is, the base ends 301*b* of the first shaft portions 301 are fixed to the base 2 via the first board attachment portions 281.

The base ends 302*b* of the second shaft portions 302 are fixed to ends of the second board attachment portions 282 on the one side in the component arrangement direction Da. That is, the base ends 302*b* of the second shaft portions 302 are fixed to the base 2 via the second board attachment portions 282.

Since the first shaft portions 301 are formed to have a smaller diameter than the ends of the first board attachment portions 281 to which the first shaft portions 301 are connected, steps are formed at the boundaries between the first shaft portions 301 and the first board attachment portions 281. Since the second shaft portions 302 are formed to have a smaller diameter than the ends of the second board attachment portion 282 to which the second shaft portions 302 are connected, steps are formed at the boundaries between the second shaft portions 302 and the second board attachment portions 282.

The other surface 72 of the electric board 7 is in contact with the steps of the boundaries around the board holes 7*a* so that the electric board 7 is positioned with respect to the housing 1.

The board holes 7*a* through which the first shaft portions 301 are inserted have a size such that radial gaps are formed between the first shaft portion 301 and hole peripheral portions 73 that form peripheral edges of the board holes 7*a* in the electric board 7. Similarly, the board holes 7*a* through which the second shaft portions 302 are inserted has a size such that radial gaps are formed between the hole peripheral portions 73 of the electric board 7 and the second shaft portions 302.

Each of the four recessed portions 44 is fixed to the rear cover 4 of the housing 1. Specifically, the four recessed portions 44 and the rear cover 4 are integrally formed.

Each of the four recessed portions 44 has a recess 44*a* that is recessed from the other side to the one side in the component arrangement direction Da. Specifically, as shown in FIGS. 3 to 5, among the four recessed portions 44, two recessed portions 44 provided coaxially with the first shaft portions 301 are disposed on the one side in the component arrangement direction Da with respect to the first shaft portions 301 and the electric board 7. The recesses 44*a* of the two recessed portions 44 are recessed so as to face the tip ends 301*a* of the first shaft portions 301.

Similarly, among the four recessed portions 44, the two recessed portions 44 provided coaxially with the second shaft portions 302 are arranged on the one side in the component arrangement direction Da with respect to the second shaft portions 302 and the electric board 7. The recesses 44*a* of the two recessed portions 44 are recessed so as to face the tip ends 302*a* of the second shaft portions 302.

Each of the four bonding portions 45 is formed of an adhesive 451 that is solidified. The bonding portions 45 have elasticity. For example, all of the first shaft portions 301, the second shaft portions 302, and the recessed portions 44 are made of resin constituting the housing 1, and the bonding portions 45 having elasticity are softer than the first shaft portions 301, the second shaft portions 302, and the recessed portions 44. Various types of the adhesives 451 constituting the bonding portions 45 are conceivable. For example, and the adhesives 451 are silicone-based adhesives and having elasticity in a solidified state.

Among the four bonding portions 45, the two bonding portions 45 are interposed between the first shaft portions 301 and the recessed portion 44 and between the hole peripheral portions 73 and the recessed portions 44 around the first shaft portions 301, and adhere the first shaft portions 301, the hole peripheral portions 73, and the recessed portions 44. The remaining two bonding portions 45 are interposed between the second shaft portions 302 and the recessed portions 44 and between the hole peripheral portions 73 and the recessed portions 44 around the second shaft portions 302, and adhere the second shaft portions 302, the hole peripheral portions 73, and the recessed portions 44.

Specifically, for example, around each of the second shaft portions 302, as shown in FIG. 3, the recessed portion 44 is disposed slightly apart from the second shaft portion 302 and the hole peripheral portion 73 of the electric board 7 in the component arrangement direction Da. The bonding portion 45 is formed so as to fill the gap between the hole peripheral portion 73 and the recessed portion 44 and the gap between the second shaft portion 302 and the recessed portion 44.

The same applies to a periphery of each of the first shaft portions 301. That is, the recessed portion 44 is disposed slightly apart from the first shaft portion 301 and the hole peripheral portion 73 of the electric board 7 in the component arrangement direction Da. The bonding portion 45 is formed so as to fill the gap between the hole peripheral portion 73 and the recessed portion 44 and the gap between the first shaft portion 301 and the recessed portion 44.

As shown in FIG. 2 and FIG. 4, the rear cover 4 has a facing portion 42 that faces the one surface 71 of the electric board 7 and extends along the one surface 71. Specifically, the facing portion 42 has a protruding shape that protrudes toward the other side in the component arrangement direction Da toward the space in the housing 1. The facing portion 42 has a flat surface 421 extending in the first board surface direction D1 and the second board surface direction D2 along the one surface 71 of the electric board 7 is, and the flat surface 421 faces the one surface 71 of the electric board 7.

The facing portion 42 of the rear cover 4 is bonded to the one surface 71 of the electric board 7 by an adhesive 422. Various types of the adhesive 422 are conceivable. For example, the adhesive 422 is a silicone-based adhesive. For example, the adhesive 422 also has elasticity in a solidified state similarly to the adhesives 451 constituting the bonding portions 45 (see FIG. 3) between the recessed portions 44 and the electric board 7.

Specifically, the flat surface 421 of the facing portion 42 is arranged slightly apart from the one surface 71 of the electric board 7 in the component arrangement direction Da. Then, the adhesive 422 is filled and solidified so as to fill the gap between the one surface 71 of the electric board 7 and the flat surface 421 of the facing portion 42. Accordingly, the facing portion 42 is bonded to the one surface 71 of the electric board 7 via the adhesive 422. Due to the adhesion between the facing portion 42 and the electric board 7, for example, compared to a case where the facing portion 42 and the electric board 7 are simply in contact with each other without adhesion, heat is easily transferred between the electric board 7 and the rear cover 4.

In the present embodiment, the same adhesive is used for the adhesive 422, the adhesives 411 (see FIG. 3) that bond the groove insertion portion 211a and the cover peripheral edge portion 41, and the adhesives 451 (see FIG. 3) that constitute the bonding portions 45.

The following describes effects of the present embodiment. As described above, according to the present embodiment, as shown in FIG. 3 and FIG. 10, the bonding portions 45 are interposed between the shaft portions 30 and the recessed portions 44 and between the hole peripheral portions 73 and the recessed portions 44 of the electric board 7, and bond the shaft portions 30, the hole peripheral portions 73, and the recessed portions 44. The board holes 7a have a size such that radial gaps are provided between the hole peripheral portions 73 of the electric board 7 and the shaft portions 30.

Accordingly, the electric board 7 is held with respect to the housing 1 by the bonding portions 45 and the shaft portions 30, and the difference in expansion and contraction between the housing 1 and the electric board 7 due to the temperature change can be absorbed by the radial gaps between the hole peripheral portions 73 and the shaft portions 30 and the deformation of the bonding portions 45. In other words, it is possible to hold the electric board 7 with respect to the housing 1 while allowing the board holes 7a to be displaced in the first board surface direction D1 or the second board surface direction D2 with respect to the shaft portions 30 in accordance with the difference in expansion and contraction.

Accordingly, bending deformation of the electric board 7 due to the difference in expansion and contraction between the housing 1 and the electric board 7 is less likely to occur, for example, as compared with a case where the shaft portions 30 are fitted into the board holes 7a without gaps. Therefore, it is possible to restrict the occurrence of a failure in the electric board 7 due to a temperature change.

Even if the bonding portions 45 are peeled off at the interfaces with the recessed portions 44, it is possible to prevent the bonding portions 45 from falling off from between the recessed portions 44 and the electric board 7 by the recesses 44a of the recessed portions 44.

In addition, in a manufacturing process of the sound generator 10, there is an advantage that the adhesives 451 before solidification are easily held between the recessed portions 44 and the electric board 7 by the recesses 44a of the recessed portions 44.

In addition, according to the present embodiment, the bonding portions 45 have elasticity and are softer than the shaft portions 30 and the recessed portions 44. Accordingly, a difference in expansion and contraction between the housing 1 and the electric board 7 due to a temperature change is easily absorbed by elastic deformation of the bonding portions 45. Then, it is possible to hold the electric board 7 with respect to the housing 1 such that the board holes 7a returns to the original position before the difference in expansion and contraction occurs due to the elastic force of the bonding portions 45.

Furthermore, according to the present embodiment, the recessed portions 44 are disposed apart from the shaft portions 30 and the hole peripheral portions 73 of the electric board 7, and the bonding portions 45 are formed so as to fill the gaps between the hole peripheral portions 73 and the recessed portions 44 and the gaps between the shaft portions 30 and the recessed portions 44.

Accordingly, the bonding portions 45 can have a thickness for absorbing slight relative displacement between the hole peripheral portions 73, the shaft portions 30, and the recessed portions 44 between each of the hole peripheral portions 73 and the shaft portions 30 and the recessed portions 44. Therefore, for example, the difference in expansion and contraction between the housing 1 and the electric board 7 due to the temperature change is more easily absorbed than in a case where the recessed portions 44 are in contact with the shaft portions 30 or the hole peripheral portions 73.

Furthermore, according to the present embodiment, as shown in FIG. 2 and FIG. 3, in addition to the fact that the recessed portions 44 fixed to the rear cover 4 are bonded to the electric board 7, the cover peripheral edge portion 41 and the base peripheral edge portion 211 of the rear cover 4 are bonded to each other so that the boundary between the rear cover 4 and the base 2 is sealed.

Therefore, the rear cover 4 can be provided with two functions, that is, a function of holding the electric board 7 in the housing 1 and a function of sealing and waterproofing the boundary between the rear cover 4 and the base 2. By integrating a plurality of functions using the adhesives 411 and 451 into the rear cover 4, for example, it is possible to expect an improvement in productivity when manufacturing the sound generator 10.

According to the present embodiment, the recesses 44a of the recessed portions 44 are recessed toward the one side in the component arrangement direction Da. The cover peripheral portion 41 of the rear cover 4 has the groove recessed toward the one side in the component arrangement direction Da, and the base peripheral edge portion 211 has the groove insertion portion 211a inserted into the groove of the cover peripheral edge portion 41 and bonded to the cover peripheral edge portion 41.

Therefore, when the rear cover 4 is attached to the base 2 in the manufacturing process of the sound generator 10, the adhesives 411, 451 before solidification are applied to the rear cover 4 in advance, so that the application positions of the adhesives 411, 451 before solidification can be held to some extent by the groove of the cover peripheral edge portion 41 and the recesses 44a of the recessed portion 44. Accordingly, it is possible to improve workability when the rear cover 4 is attached to the base 2.

According to the present embodiment, as shown in FIG. 2, the rear cover 4 includes the facing portion 42 that faces the one surface 71 of the electric board 7 and extends along the one surface 71. The facing portion 42 is bonded to the one surface 71 of the electric board 7. Therefore, for example, heat is more easily transferred between the electric board 7 and the rear cover 4 than in a case where the facing portion 42 and the electric board 7 are simply in contact with each other without being bonded to each other. Therefore, it is possible to dissipate the heat generated from the electric board 7 into the air outside the housing 1 via the facing portion 42.

According to the present embodiment, as shown in FIG. 2 and FIG. 3, in addition to the fact that the recessed portions 44 fixed to the rear cover 4 are bonded to the electric board 7 and the cover peripheral edge portion 41 of the rear cover 4 and the base peripheral edge portion 211 are bonded to each other, the facing portion 42 of the rear cover 4 is bonded to the one surface 71 of the electric board 7.

Therefore, the rear cover 4 can be provided with three functions: a function of holding the electric board 7 in the housing 1; a function of sealing and waterproofing the boundary between the rear cover 4 and the base 2; and a function of promoting heat dissipation from the electric board 7 to the outside of the housing 1. By integrating the plurality of functions into the rear cover 4 using the adhesives 411, 422, and 451, for example, it is possible to expect an improvement in productivity when manufacturing the sound generator 10.

In the manufacturing process of the sound generator 10, the adhesives 411, 422, and 451 before solidification can be collectively applied to the portions on the rear cover 4, which are three portions of the cover peripheral edge portion 41, the facing portion 42, and the recessed portions 44. Accordingly, it is possible to improve workability when the rear cover 4 is attached to the base 2.

Furthermore, according to the present embodiment, as shown in FIG. 2, the terminals 5 include the terminal protruding portions 51 exposed from the base inner wall surface 21a and protruding toward the electric board 7, and are connected to the electric board 7 at the tip ends 511 of the terminal protruding portions 51. As a result, the distance from the bases of the terminal protruding portions 51 to the connection portions between the terminals 5 and the electric board 7 is increased. As a result, the terminals 5 are flexibly deformed following the temperature change, and the stress applied to the connection portions between the terminals 5 and the electric board 7 is reduced. Therefore, the terminals 5 and the electric board 7 are connected to each other without using wires or the like, so that it is possible to restrict the occurrence of a failure and extend the product life of the sound generator 10 while reducing the manufacturing cost.

Furthermore, according to the present embodiment, the terminals 5 include the terminal bent portions 52 between the penetrating portions 53 of the terminals 5 penetrating the base cylindrical portion 21 and the terminal protruding portions 51, and the terminal bent portions 52 are exposed from the base inner wall surface 21a. Since the terminals 5 are more flexibly deformed by the terminal bent portions 52, the stress applied to the connection portions between the terminal 5 and the electric board 7 can be further reduced.

In addition, according to the present embodiment, the terminal metal elements 65 that electrically connect the driving unit 63 and the electric board 7 include the terminal metal element protruding portions 652 exposed from the frame 61 that supports the driving unit 63 and protrude toward the electric board 7. The terminal metal elements 65 are connected to the electric board 7 at the tip ends 652a of the terminal metal element protruding portions 652, and the terminal metal element protruding portions 652 are longer than the terminal protruding portions 51.

In this way, the distance from the bases of the terminal metal element protruding portions 652 to the connection portions between the terminal metal elements 65 and the electric board 7 is increased. Accordingly, the terminal metal elements 65 are flexibly deformed following the temperature change, the stress applied to the connection portions between the terminal metal elements 65 and the electric board 7 is reduced, and the occurrence of cracks or the like in the soldered portions connecting the terminal metal elements 65 and the electric board 7 can be restricted.

In addition, according to the present embodiment, each of the terminal metal elements 65 includes the terminal metal element bent portion 653 having the bent shape between the terminal metal element protruding portion 652 and the driving unit side end portion 651 electrically connected to the driving unit 63. The terminal metal element protruding portion 652 protrudes toward the electric board 7 by the terminal metal element bent portion 653. Thus, the tip end 652a of the terminal metal element protruding portion 652 can be connected to the electric board 7.

According to the present embodiment, as shown in FIG. 2, FIG. 3 and FIG. 6, the first board attachment portions 281 fix the first shaft portions 301 inserted through the board holes 7a to the base 2, and the second board attachment portions 282 fix the second shaft portions 302 inserted through the board holes 7a to the base 2. The second board attachment portions 282 are disposed at positions farther from the connection portions between the terminals 5 and the electric board 7 than the first board attachment portions 281, and have higher flexibility than the first board attachment portions 281. Accordingly, when the base 2 is deformed due to a temperature change, deformations of the first board attachment portions 281 are reduced by large deformations of the second board attachment portions 282. Therefore, it is possible to further reduce the stress applied to the connection portions between the terminals 5 and the electric board 7 in the vicinity of the first board attachment portions 281.

According to the present embodiment, as shown in FIG. 2, FIG. 5, and FIG. 6, the first board attachment portions 281 protrude from the partition wall 22 formed inside the housing 1, and are connected to the base inner wall surface 21a by the connection portions 283 protruding from the side surface of the first board attachment portions 281. By this configuration, the first board attachment portions 281 can be less likely to be deformed compared to, for example, a case where the first board attachment portions 281 are separated from the base inner wall surface 21a without the connection portions 283.

According to the present embodiment, the second board attachment portions 282 protrude from the partition wall 22 formed inside the housing 1 and are separated from the base inner wall surface 21a. By this configuration, the second board attachment portions 282 can be easily bent compared to, for example, a case where the side surfaces of the second board attachment portions 282 are connected to the base inner wall surface 21a.

Other Embodiments (1) In the first embodiment described above, as shown in FIG. 3 and FIG. 9, the number of board holes 7a provided in the electric board 7 is four. However, one, two, three, or five or more board holes 7a may be provided.

(2) In the first embodiment described above, as shown in FIG. 2 and FIG. 3, the same adhesive is used as the adhesive 411 that bonds the groove insertion portion 211a and the cover peripheral edge portion 41, the adhesive 422 that bonds the facing portion 42 of the rear cover 4 and the electric board 7, and the adhesives 451 that constitute the bonding portions 45. However, this is an example, and for example, the adhesives 411, 422, and 451 may be different from each other.

(3) In the first embodiment described above, as shown in FIGS. 1A to 1D and FIG. 2, the sound generator 10 is described as the electric device of the present disclosure. However, the electric device of the present disclosure may be an electric device other than the sound generator 10.

(4) The present disclosure is not limited to the above-described embodiment, and can be implemented in various modifications. Individual components or features of the above-described embodiment are not necessarily essential unless it is specifically stated that the components or the features are essential in the foregoing description, or unless the components or the features are obviously essential in principle.

The numerical value such as the number, the numerical value, the quantity, the range, or the like of components mentioned in the above-described embodiment is not limited to a specific number unless specified as being required, clearly limited to such a specific number in principle, or the like. The material, the shape, the positional relationship, and the like of a component or the like mentioned in the above embodiment are not limited to those being mentioned unless otherwise specified, or limited to specific material, shape, positional relationship, and the like in principle.

What is claimed is:

1. An electric device comprising:
    an electric board having a board hole;
    a housing accommodating the electric board;
    a shaft portion disposed in the housing and having a tip end and a base end, the base end fixed to the housing, the shaft portion being inserted into the board hole;
    a recessed portion disposed in the housing, fixed to the housing, and having a recess that is recessed so as to face the tip end of the shaft portion; and
    a bonding portion interposed between a hole peripheral portion that forms a peripheral edge of the board hole of the electric board and the recessed portion and between the shaft portion and the recessed portion, formed of an adhesive, and bonding the shaft portion, the hole peripheral portion, and the recessed portion, wherein
    the board hole has a size such that a gap is provided between the hole peripheral portion and the shaft portion.

2. The electric device according to claim 1, wherein the bonding portion has elasticity and is softer than the shaft portion and the recessed portion.

3. The electric device according to claim 1, wherein the recessed portion is disposed apart from the shaft portion and the hole peripheral portion, and
    the bonding portion is disposed so as to fill the gap between the hole peripheral portion and the recessed portion and a gap between the shaft portion and the recessed portion.

4. The electric device according to claim 1, wherein the housing includes a base to which the base end of the shaft portion is fixed, and a one-side cover that is disposed on one side in an axial direction of the shaft portion with respect to the base and to which the recessed portion is fixed,
    the recessed portion is disposed on the one side in the axial direction with respect to the electric board and the shaft portion,
    the one-side cover has a cover peripheral edge portion at a peripheral edge of the one-side cover,
    the base has a base peripheral edge portion at a peripheral edge of the base, and
    the cover peripheral edge portion and the base peripheral edge portion are bonded to each other such that a boundary between the one-side cover and the base is sealed.

5. The electric device according to claim 4, wherein the recess of the recessed portion is recessed toward the one side in the axial direction,
    the cover peripheral edge portion has a groove that is recessed toward the one side in the axial direction, and
    the base peripheral edge portion has a groove insertion portion inserted into the groove of the cover peripheral edge portion and bonded to the cover peripheral edge portion.

6. The electric device according to claim 1, wherein the housing includes a facing portion that faces one surface of the electric board and extends along the one surface, and
    the facing portion is bonded to the one surface.

7. The electric device according to claim 4, wherein the electric board has one surface provided on the one side in the axial direction, and
    the one-side cover has a facing portion that faces the one surface, extends along the one surface, and is bonded to the one surface.

8. The electric device according to claim 1, further comprising:
    a driving unit disposed in the housing; and
    a terminal configured to electrically connect the electric board and an outside of the housing, wherein
    the electric board has a circuit configured to drive the driving unit,
    the terminal includes a terminal protruding portion exposed from an inner wall surface of the housing and protruding toward the electric board, and
    the terminal is connected to the electric board at a tip end of the terminal protruding portion.

9. The electric device according to claim 8, wherein the terminal includes a terminal bent portion between a portion penetrating the housing and the terminal protruding portion, and
    the terminal bent portion is exposed from the inner wall surface of the housing.

10. The electric device according to claim 8, further comprising
    a terminal metal element configured to electrically connect the driving unit and the electric board, wherein
    the terminal metal element includes a terminal metal element protruding portion exposed from a frame that supports the driving unit and protruding toward the electric board,
    the terminal metal element is connected to the electric board at a tip end of the terminal metal element protruding portion, and
    the terminal metal element protruding portion is longer than the terminal protruding portion.

11. The electric device according to claim 10, wherein the terminal metal element includes a terminal metal element bent portion between an end portion electrically connected to the driving unit and the terminal metal element protruding portion, and
    the terminal metal element protruding portion protrudes toward the electric board by the terminal metal element bent portion.

12. The electric device according to claim 8, further comprising
    a first board attachment portion and a second board attachment portion disposed in the housing, wherein
    the shaft portion includes a plurality of shaft portions, the recessed portion includes a plurality of recessed portions, the board hole includes a plurality of board holes, the hole peripheral portion includes a plurality of hole peripheral portions, and the bonding portion includes a plurality of bonding portions, the first board attachment portion is disposed between a first shaft portion included in the plurality of shaft portions and the housing, and fixes the first shaft portion to the housing, and the second board attachment portion is disposed between a second shaft portion included in the plurality of shaft portions and the housing, fixes the second shaft portion to the housing, is disposed at a position farther from a connection portion between the terminal and the electric board than the first board attachment portion, and has higher flexibility than the first board attachment portion.

13. The electric device according to claim 12, wherein the first board attachment portion protrudes from a partition wall formed inside the housing and is connected to the inner wall surface of the housing by a connection portion protruding from a side surface of the first board attachment portion.

14. The electric device according to claim 12, wherein the second board attachment portion protrudes from a partition wall formed inside the housing and is apart from the inner wall surface of the housing.

15. The electric device according to claim 8, wherein the driving unit is configured to vibrate a diaphragm of a sounding body to generate sound.

\* \* \* \* \*